(12) United States Patent
Jeong et al.

(10) Patent No.: US 7,442,316 B2
(45) Date of Patent: Oct. 28, 2008

(54) MICROCONTACT PRINTING METHOD USING IMPRINTED NANOSTRUCTURE AND NANOSTRUCTURE THEREOF

(75) Inventors: Jun-Ho Jeong, Daejeon (KR); HyonKee Sohn, Daejeon (KR); Young-Suk Sim, Seoul (KR); Young-Jae Shin, Daejeon (KR); Eung-Sug Lee, Daejeon (KR); Kyung-Hyun Whang, Daejeon (KR)

(73) Assignee: Korea Institute of Machinery & Materials, Dae-Jeon (KR)

( * ) Notice: Subject to any disclaimer, the term of this patent is extended or adjusted under 35 U.S.C. 154(b) by 575 days.

(21) Appl. No.: 11/062,559

(22) Filed: Feb. 23, 2005

(65) Prior Publication Data

US 2005/0186405 A1 Aug. 25, 2005

(30) Foreign Application Priority Data

Feb. 24, 2004 (KR) ...................... 10-2004-0012192

(51) Int. Cl.
*B44C 1/22* (2006.01)
(52) U.S. Cl. ..................... 216/11; 216/41; 264/1.1; 264/319; 101/483
(58) Field of Classification Search ............ 216/41, 216/11; 264/1.1, 319; 101/483
See application file for complete search history.

(56) References Cited

U.S. PATENT DOCUMENTS

| | | | |
|---|---|---|---|
| 2002/0130444 A1* | 9/2002 | Hougham | 264/519 |
| 2004/0124566 A1* | 7/2004 | Sreenivasan et al. | 264/494 |
| 2005/0082700 A1* | 4/2005 | Deeman et al. | 264/2.5 |
| 2005/0120902 A1* | 6/2005 | Adams et al. | 101/483 |
| 2005/0133954 A1* | 6/2005 | Homola | 264/219 |
| 2005/0186774 A1* | 8/2005 | Gurumurthy | 438/618 |

* cited by examiner

*Primary Examiner*—Shamim Ahmed
(74) *Attorney, Agent, or Firm*—Pearl Cohen Zedek Latzer, LLP

(57) ABSTRACT

A microcontact printing method using an imprinted nanostructure is provided, wherein the microcontact printing is introduced to a nanoimprint lithography process to pattern a self-assembled monolayer (SAM). The method includes forming a nanostructure on a substrate by using the nanoimprint lithography process; and patterning the nanostructure with the microcontact printing method. The operation of patterning includes: depositing a metal thin film on the nanostructure; contacting a plate with the nanostructure to selectively print the SAM on the nanostructure, wherein the SAM is inked on the plate and the metal thin film is deposited on the nanostructure; selectively removing the metal thin film by using the SAM as a mask; removing the SAM from the nanostructure; and patterning the substrate by using the remaining metal thin film on the nanostructure as a mask.

19 Claims, 3 Drawing Sheets

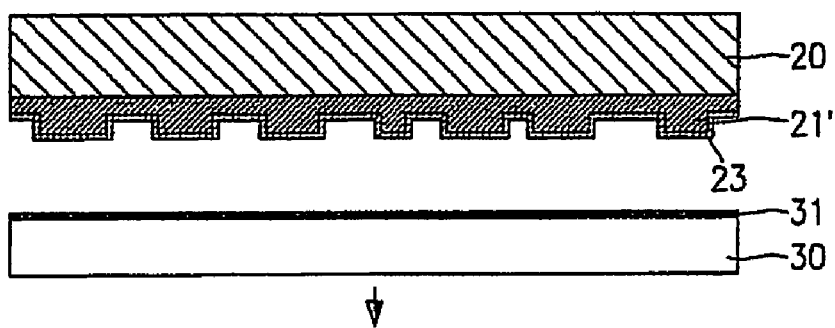
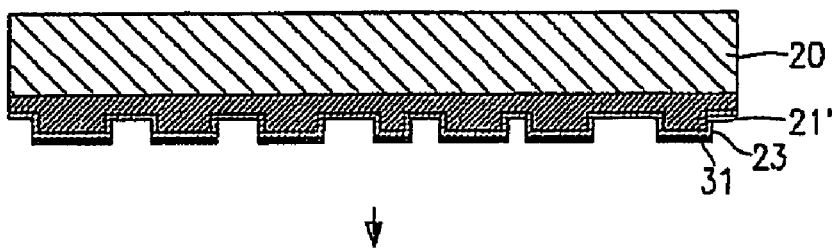
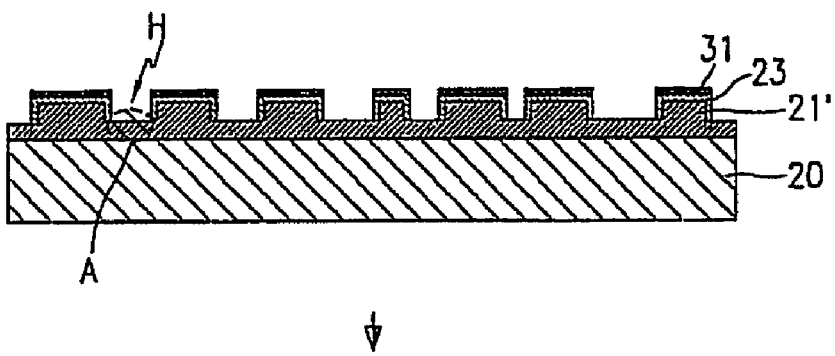
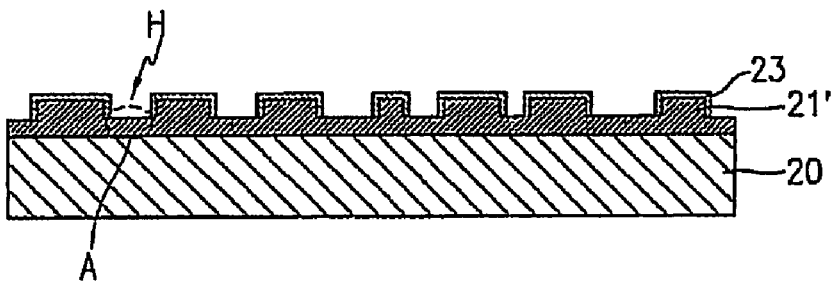
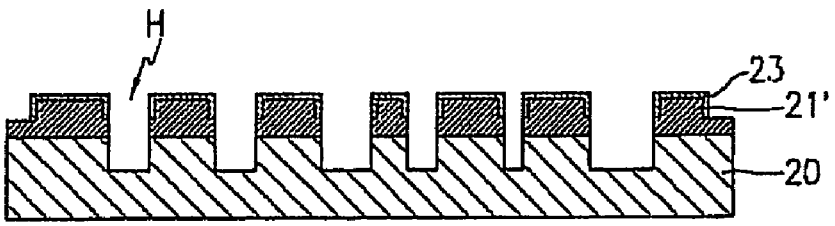

MICROCONTACT PRINTING METHOD USING IMPRINTED NANOSTRUCTURE AND NANOSTRUCTURE THEREOF

CROSS REFERENCE TO RELATED APPLICATION

This application claims priority to and the benefit of Korean Patent Application No. 10-2004-0012192, filed on Feb. 24, 2004, which is hereby incorporated by reference for all purposes as if fully set forth herein.

BACKGROUND OF THE INVENTION (a) Field of the Invention

The present invention relates to a microcontact printing method, and more specifically, to a microcontact printing method using a nanoimprinted nanostructure to transfer a pattern with a size of several tens of nanometers.

(b) Description of Related Art

Nanoimprint lithography technology is a technology for pressing a surface of a polymer resist coated on a substrate with a stamp having an imprinted nanostructure thereon to transfer the nanostructure.

In the nanoimprint process initially developed by Prof. Chou at Princeton Univ. in 1996, a base sheet coated with a polymethylmethacrylate (PMMA) resist is pressed with a stamp having a nano-sized embossed structure fabricated by an electronic beam lithography process at a high temperature, and is then separated in a cooling process. Accordingly, a negative pattern of the nanostructure embossed on the stamp is imprinted on the resist, and a residual resist that remains at a pressed portion of the resist surface is completely removed through anisotropic etching.

After that, a laser-assisted direct imprint (LADI) method, one of the nanoimprint methods, was developed. The LADI method uses a single 20 ns excimer laser having a wavelength of 308 nm to instantaneously melt a silicon wafer or a resist coated on the silicon wafer. Similarly, nanosecond laser-assisted nanoimprint lithography (LA-NIL) applied to polymer was developed. The LA-NIL imprints the nanostructure having a line width of 100 nm and a depth of 90 nm on the polymer-based resist.

In addition, Prof. Sreenivasan et al. at the University of Texas at Austin proposed a step & flash imprint lithography (SFIL) process in 1999. Through this process, a nanostructure can be fabricated at room temperature by using a UV light curing material. In the SFIL process, the nanostructure is imprinted by using a UV transmissive material such as quartz or Pyrex glass as a stamp, and is cured by UV light.

Further, a microcontact printing method, which is a typical soft lithography process, includes steps of fabricating a polydimethylsiloxane (PDMS) stamp; giving functionality to patterns to transfer the patterns to the base; and obtaining the same pattern as a mold through etching and deposition processes.

In the microcontact printing, an elastomer stamp having a fabricated pattern thereon is duplicated from a master. In addition, the elastomer stamp is dipped into a monolayer-forming ink. Here, a wet ink or a contact ink is used. The dipped stamp is used to print the pattern, and the printed pattern protects a metal base layer during the subsequent etching process.

However, With the microcontact printing process, it is difficult to have an independent processing condition due to several problems in processing. That is, it is necessary to experimentally verify the process of applying a high resolution (less than 20 nm) pattern using the elastomer.

For example, distortion or deformation related to the elastomer material should be avoided. In the current patterning molding process, problems include: a paring problem in that gravity, adhesive strength, and capillary forces are exerted on the elastomer material to collapse a shape thereof or incur defects; a sagging problem in that the elastomer material sags when a ratio of a patterned portion to the remaining non-patterned portion is low; and a shrinking problem in that an accurate record cannot be made due to a flexible PIMS.

Furthermore, the pattern transfer should have accurate reproducibility, and the quality of formed patterns and structures should be improved. However, the microcontact printing process does not yet meet the requirement of a fine line pattern for a complicated electronic apparatus.

The conventional microcontact printing process can implement a micro pattern of up to 300 nm due to the characteristics of polymer, while it is almost impossible to implement the micro pattern of less than 100 nm due to poor resolution and excessive defects.

In addition, when fabricated in a multi-layered structure, the conventional microcontact printing process has a problem in that misalignment may occur due to deformation of the pattern and distortion of the structure during a deposition process.

SUMMARY OF THE INVENTION

The present invention provides a microcontact printing method using an improved nanoimprinted nanostructure capable of fabricating a nanostructure that requires a critical dimension (CD) of less than 100 nm. Here, the foregoing problems are solved through a nanoimprint lithography process.

According to an exemplary embodiment of the present invention, there is provided a microcontact printing method using an imprinted nanostructure wherein the microcontact printing is introduced to a nanoimprint lithography process to pattern a SAM (self-assembled monolayer). The method comprises steps of forming a nanostructure on a substrate by using the nanoimprint lithography process, and patterning the nanostructure with the microcontact printing method. The step of patterning comprises steps of depositing a metal thin film on the nanostructure; contacting a plate with the nanostructure to selectively print the SAM on the nanostructure, wherein the SAM is inked on the plate and the metal thin film is deposited on the nanostructure; selectively removing the metal thin film by using the SAM as a mask; removing the SAM from the nanostructure; and patterning the substrate by using the remaining metal thin film on the nanostructure as a mask.

According to another exemplary embodiment of the present invention, there is provided a microcontact printing method using an imprinted nanostructure wherein the microcontact printing is introduced to a nanoimprint lithography process to pattern a bio device, the method comprising steps of: forming a nanostructure on a substrate by using the nanoimprint lithography process; and patterning the nanostructure with the microcontact printing method. The step of patterning comprises steps of depositing a metal thin film on the nanostructure, and contacting a plate with the nanostructure to selectively print bio thin film on the nanostructure, wherein the bio thin film is inked on the plate and the metal thin film is deposited on the nanostructure.

The step of forming a nanostructure may include steps of: preparing a stamp, wherein a pattern corresponding to the nanostructure to be formed is provided to the stamp; coating a resist on the substrate or the stamp; contacting the stamp with the substrate to press the stamp against the resist between the substrate and the stamp; and curing the resist.

In addition, the resist may be a UV curing resin or a thermosetting resin.

In addition, the metal thin film may be deposited on the nanostructure through sputtering or evaporation by direct heating.

In addition, the metal thin film deposited on the nanostructure may be a metal selected from a group containing Au, Ag, and Pd.

In addition, the step of contacting the plate with the nanostructure to selectively print the SAM or the bio thin film on the nanostructure may be performed by contacting the plate with an end of the embossed portion of the nanostructure.

In addition, the plate may have a flat surface on the side for contacting the nanostructure, and the bio thin film or the SAM may be deposited on the flat surface to ink the nanostructure.

According to still another aspect of the present invention, there is provided a bio device and a nanostructure fabricated by using the aforementioned printing method.

BRIEF DESCRIPTION OF THE DRAWINGS

The above and other features and advantages of the present invention will become more apparent by describing in detail exemplary embodiments thereof with reference to the attached drawings, in which:

FIG. 2A through 2I are diagrams for explaining steps of transferring a pattern from a stamp onto the resist, covering a metal thin film on the transferred pattern, and fabricating the final nanostructure through several etchings of the nanostructure deposited with the metal thin film according to an exemplary embodiment of the present invention

DETAILED DESCRIPTION

Now, an exemplary embodiment of the present invention will be described with reference to the attached drawings so that those skilled in the art can easily practice the present invention.

Figure 1:
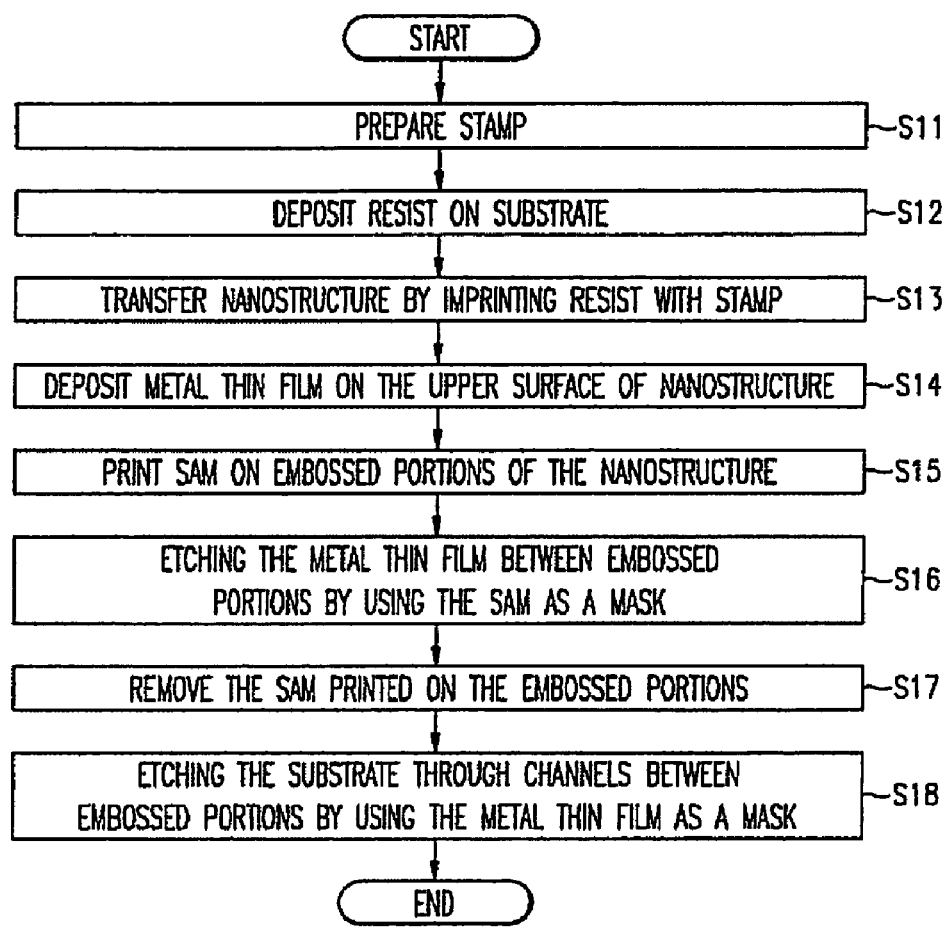
FIG. 1 is a flow chart for explaining a microcontact printing method using a nanoimprint lithography process according to an exemplary embodiment of the present invention.

FIG. 1 is a flow chart for explaining a microcontact printing method using a nanoimprint lithography process according to an exemplary embodiment of the present invention, and FIG. 2A through 2I are diagrams for explaining steps thereof.

As shown in FIG. 1, in the complex microcontact printing method according to the present invention, a substrate 20 on which a nanostructure is transferred from a stamp 10 is prepared. Next, the substrate 20 is patterned with the microcontact printing method.

Therefore, the process according to an embodiment of the present invention starts with a step of preparing a stamp 10 (S11). The stamp 10 has a pattern corresponding to a nanostructure to be formed. With a UV nanoimprint lithography process, it is desirable that the stamp 10 be made of a UV transmissive material. As an example of the UV transmissive material, quartz may be used. Here, the UV light transmits through the stamp 10 to cure a UV curing resin filled into the stamp. The stamp may be made of PDMS (polydimethylsiloxane). Alternatively, a heating nanoimprint lithography process may be used.

At a step S12, a resist 21 is coated on the substrate 20 to be imprinted (refer to FIG. 2A) Here, a UV curing or thermosetting polymer may be used for the resist 21 according to a type of the employed nanoimprint lithography process. In addition, a silicon wafer is typically used for the substrate 20.

At a step S13, the stamp 10 having a predetermined pattern thereon contacts an upper surface of the resist 21 and is pressed thereon at a predetermined pressure. Next, the stamp 10 is UV-illuminated or heated (refer to FIG. 2B) Here, the UV light or heat transmits through the stamp 10 to illuminate or heat the resist 21. Accordingly, the resist 21 is UV-exposed or heated and is cured to nanostructures 21' (refer to FIG. 2C).

Next, the microcontact printing process is performed with the substrate 20 on which the nanostructure fabricated by using the nanoimprint lithography process of the aforementioned S11 to S13 is provided.

Figure 2A:
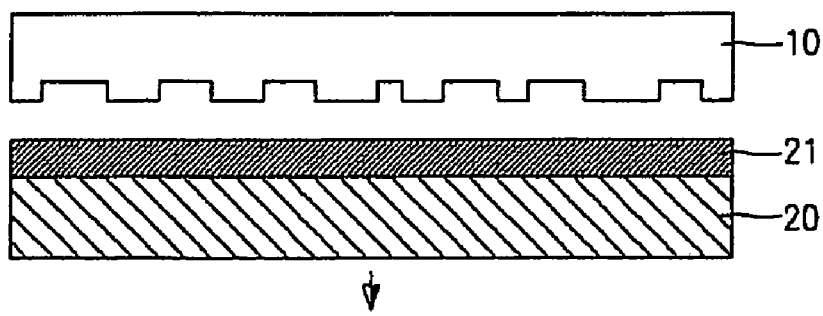
Figure 2B:
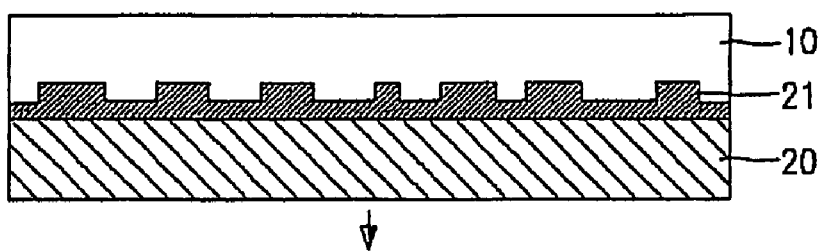
Figure 2C:
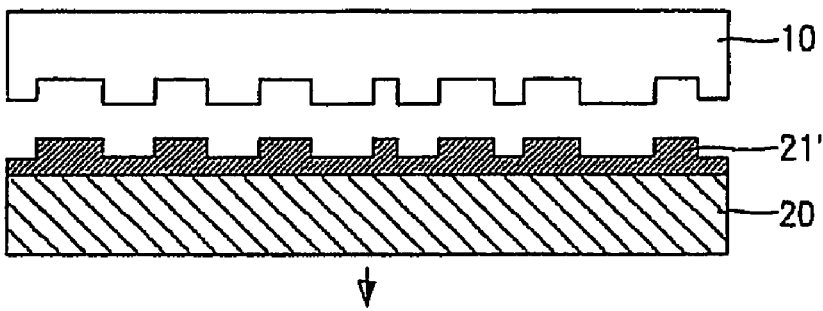
Figure 2D:
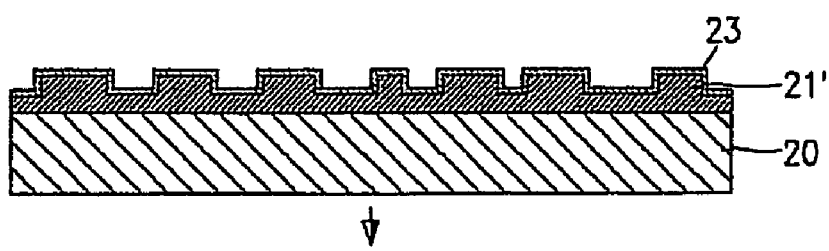

At a step S14, a metal thin film 23 having a predetermined thickness used for a mask in the etching process is deposited on the nanostructure 21' (refer to FIG. 2D). The metal thin film 23 may be made of a metal having good conductivity, such as gold (Au, aurum), silver (Ag, argentums), or palladium (Pd). Here, sputtering or evaporation by direct heating may be used as a technology of depositing the metal thin film 23 on the nanostructure 21'. As a method of depositing a metal by sputtering, DC-, RF-, magnetron-, and reactive-sputtering, etc., may be used, according to a method of generating plasma and a method of deriving deposition. In addition, as a method of depositing a metal by evaporation, thermal evaporation, E-beam evaporation, and RF-inductive heating may be used, according to an evaporation method.

After the metal thin film 23 is deposited as described above, a protective layer to be used as a mask at the next etching process S16 is printed on embossed portions. This will be described below in more detail.

At a step S15, a plate 30 having a self-assembled monolayer (SAM) (or a bio thin film) 31, which is a hydrophilic material having excellent reactivity with the aforementioned metal thin film 23, inked on a flat surface thereof, contacts the nanostructure 21' (refer to FIG. 2E) with the embossed portion of the nanostructure 21' facing downward. Therefore, the aforementioned SAM (or bio thin film) 31 is printed only on ends of the embossed portions of the nanostructure 21' (refer to FIG. 2F).

In addition, for suppressing diffusion and implementing the high resolution pattern, it is desirable that a solution of the SAM film be in good contact with the metal thin film 23 such as Au, Ag, and Pd deposited on the nanostructure 21'.

Next, At a step S16, since the SAM (or the bio thin film) 31 printed on ends of the embossed portion of the nanostructure 21' serves as a mask, etching is selectively performed on floors A of channels H in the embossed portions so that the metal thin film 23 deposited on the floors A is etched (refer to FIG. 2F). In particular, when the bio thin film is provided at the ends of the embossed portions of the nanostructure 21', the resulting device fabricated at the step S15 or the step S16 may be directly applied to implementation of the bio device.

Etching can be largely classified into wet etching which uses a liquid, and dry etching such as reactive ion etching which uses plasma. However, the etching used for the present invention includes the two types of etching.

In particular, the reactive ion etching may be anisotropic etching using a gas having a high selectivity of the SAM 31 to the deposited metal thin film 23. A mechanism of etching starts with sputtering by providing plasma at the position to be etched, and providing the external potential. Plasma discharge generates chemical reactants from the injected gas. An etching gas is selected from a gas capable of generating volatile by-products by chemically reacting with the material to be etched. Chemical-based ideal dry etching can be largely classified into a reaction in plasma and a reaction at the surface where the etching is performed. The above reactions are performed in a chamber very rapidly. During the reactions, the process of generating by-products is a very important step, because the etching may not be performed when an appropriate pressure is not given to the products. In the etching process, the SAM 31 serving as a mask plays a significant role in transferring the nano-sized pattern into the base by increasing the etch ratio.

At a step S17, the SAM 31 printed at the ends of the embossed portions of the nanostructure 21 is removed (refer to FIG. 2H).

At a step S18, the metal thin film 23 selectively only remains on the nanostructure 21' through the aforementioned steps S16 and S17. In other words, while the metal thin film 23 remains on the embossed portion of the nanostructure 21', the metal thin film 23 deposited on the floor A of the channel H of the nanostructure 21' is peeled off. Therefore, desired portions, i.e., the floors A, may be selectively etched by using the metal thin film 23 as a mask. Here, the anisotropic etching is performed such that the metal thin film 23 coated at the side of the channels H is not etched. Thus, the substrate 20 having the desired pattern thereon can be obtained (refer to FIG. 2I).

The above microcontact printing method using the nanostructures can be adapted to nano-sized metal-oxide semiconductors, field-effect transistors (MOSFETs), metal-semiconductor field-effect transistors (MESFETs), high-density magnetic storage devices, high-density compact disks (CDs), nano-sized metal-semiconductor-metal photodetectors (MSMPDs), high-speed single-electron transistor memories, and nano bio devices.

According to the present invention, a nanostructure fabricated by using a nanoimprint lithography process and formed on a substrate is provided. Therefore, it is possible to effectively and easily fabricate bio devices and implement micro patterns of less than 100 nm by overcoming the limitation of a critical dimension (CD) caused by stamp flexibility of the aforementioned microcontact printing method.

While the present invention has been particularly shown and described with reference to exemplary embodiments thereof, it will be understood by those skilled in the art that various changes in form and details may be made therein without departing from the spirit and scope of the invention as defined by the appended claims. Therefore, the scope of the invention should be defined by the appended claims, and all differences within the scope will be construed as being included in the present invention.

What is claimed is:

1. A microcontact printing method using an imprinted nanostructure wherein microcontact printing is introduced to a nanoimprint lithography process to pattern a SAM (self-assembled monolayer), the method comprising steps of:
    forming a nanostructure on a substrate by using the nanoimprint lithography process; and
    patterning the nanostructure with a microcontact printing method, wherein the step of patterning comprises steps of
        depositing a metal thin film on the nanostructure,
        contacting a plate with the nanostructure to selectively print the SAM on the nanostructure wherein the SAM is inked on the plate and the metal thin film is deposited on the nanostructure,
        selectively removing the metal thin film by using the SAM as a mask,
        removing the SAM from the nanostructure, and
        patterning the substrate by using the remaining metal thin film on the nanostructure as a mask,
    wherein the step of selectively removing the metal thin film from the nanostructure by using the SAM as a mask is performed by selectively removing only the metal thin film deposited in channels between the embossed portions of the nanostructure.

2. The microcontact printing method using an imprinted nanostructure of claim 1, wherein the step of forming a nanostructure comprises steps of:
    preparing a stamp, wherein a pattern corresponding to the nanostructure to be formed is provided to the stamp;
    coating a resist on a substrate or the stamp;
    contacting the stamp with the substrate to press the stamp against the resist between the substrate and the stamp; and
    curing the resist.

3. The microcontact printing method using an imprinted nanostructure of claim 1, wherein the step of contacting the plate with the nanostructure to selectively print the SAM on the nanostructure is performed by contacting the plate with ends of the embossed portions of the nanostructure.

4. The microcontact printing method using an imprinted nanostructure of claim 3, wherein the plate has a flat surface on the side for contacting the nanostructure, and the SAM is deposited on the flat surface.

5. The microcontact printing method using an imprinted nanostructure of claim 1, wherein the step of patterning the substrate is performed by selectively patterning the substrate to channel floors between the embossed portions of the nanostructure through anisotropic etching.

6. The microcontact printing method using an imprinted nanostructure of claim 2, wherein the resist is a UV curing resin.

7. The microcontact printing method using an imprinted nanostructure of claim 1, wherein the metal thin film is deposited on the nanostructure through sputtering or evaporation by direct heating.

8. The microcontact printing method using an imprinted nanostructure of claim 7, wherein the metal thin film deposited on the nanostructure is a metal selected from a group containing Au, Ag, and Pd.

9. The microcontact printing method using an imprinted nanostructure of claim 1, wherein the stamp is made of PDMS (polydimethylsiloxane).

10. A microcontact printing method using an imprinted nanostructure wherein microcontact printing is introduced to a nanoimprint lithography process to pattern a bio device, the method comprising steps of:
    forming a nanostructure on a substrate by using the nanoimprint lithography process; and
    patterning the nanostructure with the microcontact printing method, wherein the step of patterning comprises steps of
        depositing a metal thin film on the nanostructure,
        contacting a plate with the nanostructure to selectively print bio thin film on the nanostructure, wherein the bio thin film is inked on the plate and the metal thin film is deposited on the nanostructure, and
        selectively removing the metal thin film by using the bio thin film as a mask,
    wherein the step of selectively removing the metal thin film by using the bio thin film as a mask is performed by selectively removing only the metal thin film deposited in channels between the embossed portions of the nanostructure.

11. The microcontact printing method using an imprinted nanostructure of claim 10, wherein the step of forming a nanostructure comprises steps of:

preparing a stamp, wherein a pattern corresponding to the nanostructure to be formed is provided to the stamp;

coating a resist on the substrate or the stamp;

contacting the stamp with the substrate to press the stamp against the resist between the substrate and the stamp; and curing the resist.

12. The microcontact printing method using an imprinted nanostructure of claim 10, wherein the step of contacting the plate with the nanostructure to selectively print the bio thin film on the nanostructure is performed by contacting the plate with ends of the embossed portions of the nanostructure.

13. The microcontact printing method using an imprinted nanostructure of claim 12, wherein the plate has a flat surface on the side for contacting the nanostructure, and the bio thin film is deposited on the flat surface.

14. The microcontact printing method using an imprinted nanostructure of claim 11, wherein the resist is a UV curing resin.

15. The microcontact printing method using an imprinted nanostructure of claim 10, wherein the metal thin film is deposited on the nanostructure through sputtering or evaporation by direct heating.

16. The microcontact printing method using an imprinted nanostructure of claim 15, wherein the metal thin film deposited on the nanostructure is a metal selected from a group containing Au, Ag, and Pd.

17. The microcontact printing method using an imprinted nanostructure of claim 10, wherein the stamp is made of PDMS (polydimethylsiloxane).

18. The microcontact printing method using an imprinted nanostructure of claim 2, wherein the resist is a thermosetting resin.

19. The microcontact printing method using an imprinted nanostructure of claim 11, wherein the resist is a thermosetting resin.

* * * * *